(12) United States Patent
Pradier et al.

(10) Patent No.: US 10,866,271 B2
(45) Date of Patent: Dec. 15, 2020

(54) DEVICE AND METHOD FOR DETECTING AN ELECTRICAL LOAD

(71) Applicant: ZODIAC AERO ELECTRIC, Montreuil (FR)

(72) Inventors: Jean-Clair Pradier, Montreuil (FR); William Roze, Montreuil (FR)

(73) Assignee: ZODIAC AERO ELECTRIC, Montreuil (FR)

( * ) Notice: Subject to any disclaimer, the term of this patent is extended or adjusted under 35 U.S.C. 154(b) by 53 days.

(21) Appl. No.: 15/975,488

(22) Filed: May 9, 2018

(65) Prior Publication Data

US 2018/0328972 A1  Nov. 15, 2018

(30) Foreign Application Priority Data

May 9, 2017 (FR) ...................................... 17 54054

(51) Int. Cl.
| | | |
|---|---|---|
| *G01R 31/00* | (2006.01) | |
| *G01R 27/02* | (2006.01) | |
| *H02J 4/00* | (2006.01) | |
| *G01R 27/16* | (2006.01) | |

(52) U.S. Cl.
CPC .......... *G01R 31/008* (2013.01); *G01R 27/02* (2013.01); *G01R 27/16* (2013.01); *H02J 4/00* (2013.01); *B64D 2221/00* (2013.01)

(58) Field of Classification Search
None
See application file for complete search history.

(56) References Cited

U.S. PATENT DOCUMENTS

| | | | | |
|---|---|---|---|---|
| 6,081,123 A | * | 6/2000 | Kasbarian | H02J 13/0048 324/521 |
| 2006/0028779 A1 | * | 2/2006 | Bax | H01H 83/226 361/93.1 |
| 2010/0308653 A1 | * | 12/2010 | Gestri | B60R 16/03 307/26 |
| 2011/0215780 A1 | * | 9/2011 | Lee | G05F 1/10 323/282 |
| 2013/0329330 A1 | * | 12/2013 | Srinivas | H02H 9/002 361/93.9 |
| 2014/0340111 A1 | * | 11/2014 | Mercadal | G01R 31/008 324/764.01 |
| 2017/0254871 A1 | * | 9/2017 | Sestok, IV | G01R 35/005 |

FOREIGN PATENT DOCUMENTS

| | | |
|---|---|---|
| EP | 0 827 255 A1 | 3/1998 |
| EP | 0 843 400 A1 | 5/1998 |

OTHER PUBLICATIONS

French Search Report and Written Opinion dated Jan. 22, 2018, issued in corresponding French Patent Application No. 1754054, filed May 9, 2017, 7 pages.

\* cited by examiner

*Primary Examiner* — Jared Fureman
*Assistant Examiner* — Joel Barnett
(74) *Attorney, Agent, or Firm* — Christensen O'Connor Johnson Kindness PLLC

(57) ABSTRACT

A device for detecting an electrical load connected to an electric power supply network. The device comprises means for injecting a test signal into the electrical network and means for identifying the presence and the nature of an electrical load connected to the electrical network on the basis of the test signal.

9 Claims, 4 Drawing Sheets

DEVICE AND METHOD FOR DETECTING AN ELECTRICAL LOAD

BACKGROUND

The present invention relates to the detection of an electrical load connected to an electric power supply network, and more particularly to a device and to a method for detecting an electrical load connected to an electric power supply network of an aircraft.

An electric power distribution network within an aircraft has a pyramid structure.

The electric power is first of all produced by using a portion of the power supplied by the turbines of the aircraft to drive an electric power generator. The electric power that is generated is supplied to distribution cabinets, also referred to using the term distribution cores, so as then to be redistributed either to electrical loads or to secondary distribution boxes.

It is common for optional electrical loads to be connected temporarily to the distribution cores of the aircraft.

When the optional loads are connected, the system for managing the electrical distribution network of the aircraft must be informed of their connection to the distribution network. This information enables the electrical distribution cores to improve the management of the distribution of electric power within the aircraft.

In order to detect the presence of an electrical load connected to a distribution core, one solution consists in programming the configuration of the electrical loads that are connected in a memory of the system for managing the distribution network.

However, this method exhibits a number of drawbacks.

Programming the configuration of the optional electrical loads is a complex and time-consuming operation that may additionally lead to programming errors. It has to be performed as soon as an electrical load is connected to or disconnected from a distribution core of the aircraft.

Programming the configuration of the optional electrical loads is not always possible within the allocated time, in particular when the turnaround time of the aircraft is very short.

When an optional electrical load is connected, erroneously or following a malfunction, to a distribution core of the aircraft, the management system is not alerted to the presence of this additional electrical load. As a result, it is likely that the core will malfunction.

A second solution known from the prior art consists in briefly supplying power to the optional electrical loads connected to the network when the electrical distribution network is powered up, and in measuring the currents consumed in order to determine whether said loads are connected to the network.

However, this method exhibits a number of drawbacks.

During the transitory phase of supplying power to an optional electrical load, depending on the nature of the electrical load, the current consumed during this transitory phase may possibly not be significant. In this case, the electrical distribution system may not detect the electrical load connected to the network.

Depending on the nature of the load, the temporary supplying of power to the load may damage it or lead to it malfunctioning.

The aim of the invention is therefore to mitigate the drawbacks linked to the conventional methods for detecting an electrical load connected to an electric power supply network.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In light of the above, the invention proposes a device for detecting an electrical load connected to an electric power supply network, comprising means for injecting a test signal into the electrical network and means for identifying the presence and the nature of the electrical load connected to the electrical network on the basis of the test signal.

Another subject of the invention is a controller for managing the supply of electric power to an electrical load for an aircraft, comprising an electric power supply line and a load detection device linked to said power supply line.

Another subject of the invention is a method for detecting an electrical load supplied with power by an electric power supply controller comprising an electric power supply line and a device for detecting an electrical load linked to said power supply line.

According to another feature of the method, the detection device compares the value of the impedance of the load with a predetermined value.

DESCRIPTION OF THE DRAWINGS

Other aims, features and advantages of the invention will become apparent on reading the following description, given solely by way of nonlimiting example and made with reference to the appended drawings, in which.

DETAILED DESCRIPTION

The invention proposes a device for detecting an electrical load connected to an electric power supply network, comprising means for injecting a test signal into the electrical network and means for identifying the presence and the nature of the electrical load connected to the electrical network on the basis of the test signal.

The test signal is a very low-voltage signal.

'Very low-voltage signal' is understood to mean a signal defined by the French standard NF C18-510, that is to say a signal with a voltage of less than 50 volts.

The means for injecting the very low-voltage signal are thus suitable for injecting a test signal into the electrical network that is separate from the main power supply of the network.

According to another feature, the means for injecting a test signal comprise a first switch commanded by a processing unit and a very low-voltage source.

Advantageously, the means for injecting a test signal comprise a first switch commanded by the processing unit and a very-low voltage source.

According to another feature, the device comprises a second switch commanded by the processing unit, the first and second switches being commanded alternately.

The means for identifying the presence and the nature of the electrical load preferably comprise an anti-aliasing filter connected to a processing unit.

Another subject of the invention is a controller for managing the supply of electric power to an electrical load for an aircraft, comprising an electric power supply line and a load detection device linked to said power supply line.

According to one feature of the controller according to the invention, the load detection device comprises means for injecting a test signal into the electrical network and means for identifying the presence and the nature of the electrical load connected to the electrical network on the basis of the test signal.

The load detection device is preferably connected in parallel across the electric power supply line.

Advantageously, the power supply line comprises a fuse connected in series across the power supply line, the detection device being connected across the power supply line in parallel with the fuse.

Another subject of the invention is a method for detecting an electrical load supplied with power by an electric power supply controller comprising an electric power supply line and a device for detecting an electrical load linked to said power supply line.

This method includes at least one step during which the detection device injects a test signal into the line supplying power to the load, the main power supply of the power supply line being cut.

According to another feature of the method, the detection device compares the value of the impedance of the load with a predetermined value.

Figure 1:
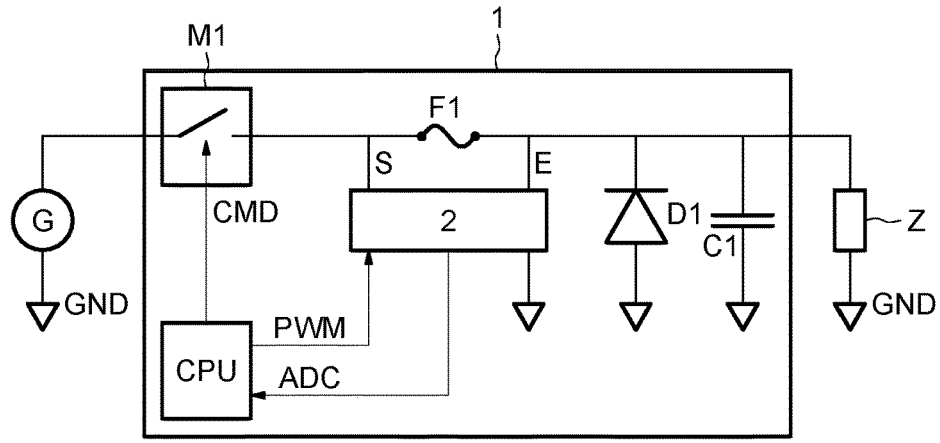
FIG. 1 is a schematic view of a device according to the invention intended to detect an electrical load connected to an electric power supply network of an aircraft.

Reference is made to FIG. 1, which illustrates an electrical distribution circuit for an aircraft that includes a generator linked to a distribution core and an electrical load connected to a distribution core of an aircraft. The distribution core comprises an SSPC (for solid-state power controller) power supply controller 1 that manages the supply of electric power to an optional avionic load Z and a generator G driven by a turbine of the aircraft that supplies an electric voltage to the electrical distribution network of the aircraft. This electric voltage supplied by the generator G is the main power supply for the distribution circuit. The output of the generator G is connected to the input of the SSPC (for solid-state power controller) power supply controller 1, and the output of the SSPC power supply controller 1 is connected to the electrical load Z.

The SSPC power supply controller 1 comprises a switch M1, a processing unit CPU and means for identifying the presence and the nature of the load Z.

During operation, the processing unit CPU emits a command signal CMD that commands the opening and the closure of the switch M1.

The input of the switch M1 is connected to the output of the generator G, and the output of the switch M1 is connected to a first connection of a fuse F1. The second connection of the fuse F1 is linked to the cathode of a reverse diode D1, to a first connection of a capacitor C1 and to a first connection of the load Z.

A 'reverse diode' is understood here to mean a diode in which the direction of flow of the current is the opposite direction with respect to the current flowing through the load Z. In this case, reference is made to a 'freewheeling diode' when the load Z is an inductive load and discharges into said diode in the reverse direction and the current flows through said diode. This makes it possible to avoid an overvoltage, upon opening of the switch M1, at the terminals of the load when the latter is inductive.

The capacitor C1 represents the equivalent capacitance of the output filter of the SSPC power supply controller 1 (not shown), the capacitance of the cable and the capacitances of the other components connected to the line of the SSPC power supply controller 1.

The anode of the diode D1 and the second connection of the capacitor C1 and of the optional load Z are linked to the ground GND common to the ground of the generator G.

The means for identifying the presence and the nature of the load Z interact with the processing unit CPU and comprise a load detection device 2.

The load detection device 2 is intended to detect the connection and the nature of the load Z to the distribution core of the aircraft. This device comprises two terminals with connections E and S connected in parallel to the fuse F1. The terminal S is linked to the output of the switch M1, and the terminal E is connected to the cathode of the diode D1.

For example, the processing unit is embodied as a processor. However, it could be any device capable of performing the tasks accomplished by the processing unit CPU. It may in particular be a microcontroller.

The optional load detection device 2 is linked to the processing unit CPU by two connections PWM and ADC. The first connection PWM is used by the processing unit CPU to drive the load detection device 2. The second connection ADC is used by the processing unit CPU to receive information from the load detection device 2.

Figure 2:
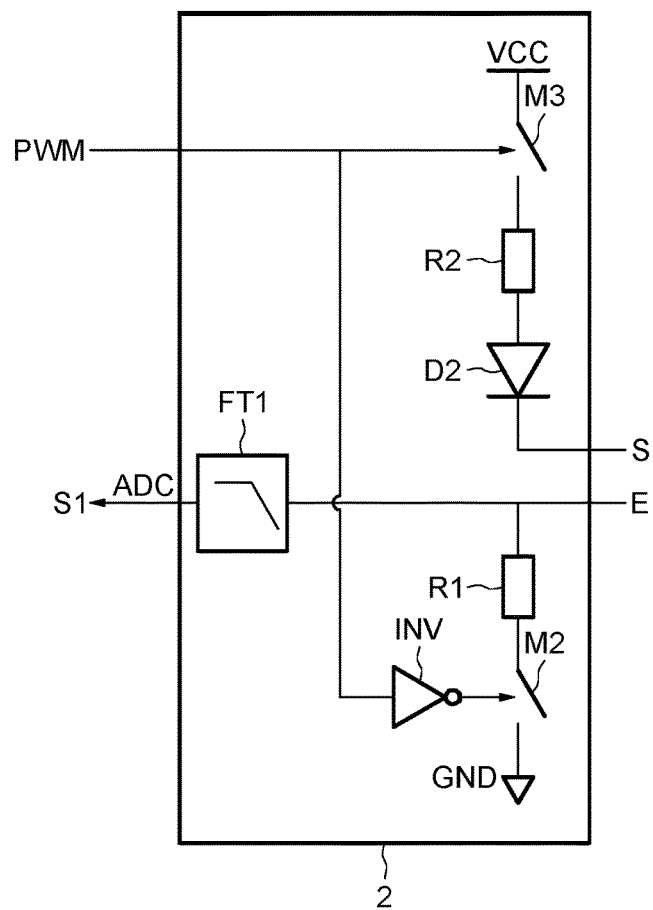
FIG. 2 illustrates a first embodiment of an optional load detection device.

Reference is made to FIG. 2, which illustrates a first embodiment of the load detection device 2. This embodiment of the load detection device 2 identifies the presence and the nature of the load Z depending on the waveform of an electric voltage.

In this embodiment, the load detection device 2 comprises a spectrum anti-aliasing filter FT1 whose output S1 is connected to the processing unit CPU via the connection ADC. A resistor R1 is connected to the input E of the filter FT1 and to a switch M2. The other terminal of the switch M2 is connected to ground GND.

The device 2 moreover comprises means for injecting a very low-voltage test signal into the load, comprising a switch M3 connected to a very low-DC voltage source VCC of less than 50 volts, for example equal to 15 volts, and to a resistor R2. The second terminal of the resistor R2 is linked to the anode of a diode D2. The cathode of the diode D2 is linked to the output S of the detection device.

The switches M2 and M3 are commanded by the output PWM of the processing unit CPU in a complementary manner, an inverter device INV being linked between the connection PWM and the command input of the switch M2.

During operation, according to the first embodiment, when the generator G supplies power to the circuit, the processing unit CPU commands the switch M1 into the open position. The load Z is not supplied with power. The electrical load Z is detected with the main power supply shut off.

The processing unit CPU generates a low-frequency square-wave signal PWM that drives the two switches M2 and M3 in a complementary manner.

When the switch M3 is closed, the load is supplied with power by the voltage source VCC. The very low-voltage source VCC is chosen so as to be relatively insensitive to a change in ground between the SSPC power supply controller 1 and the return of the load Z.

The waveform of the signal S1 at the output of the filter FT1 is dependent on the impedance of the optional load Z.

The signal S1 travels to the processing unit CPU via the connection ADC.

Figure 3:
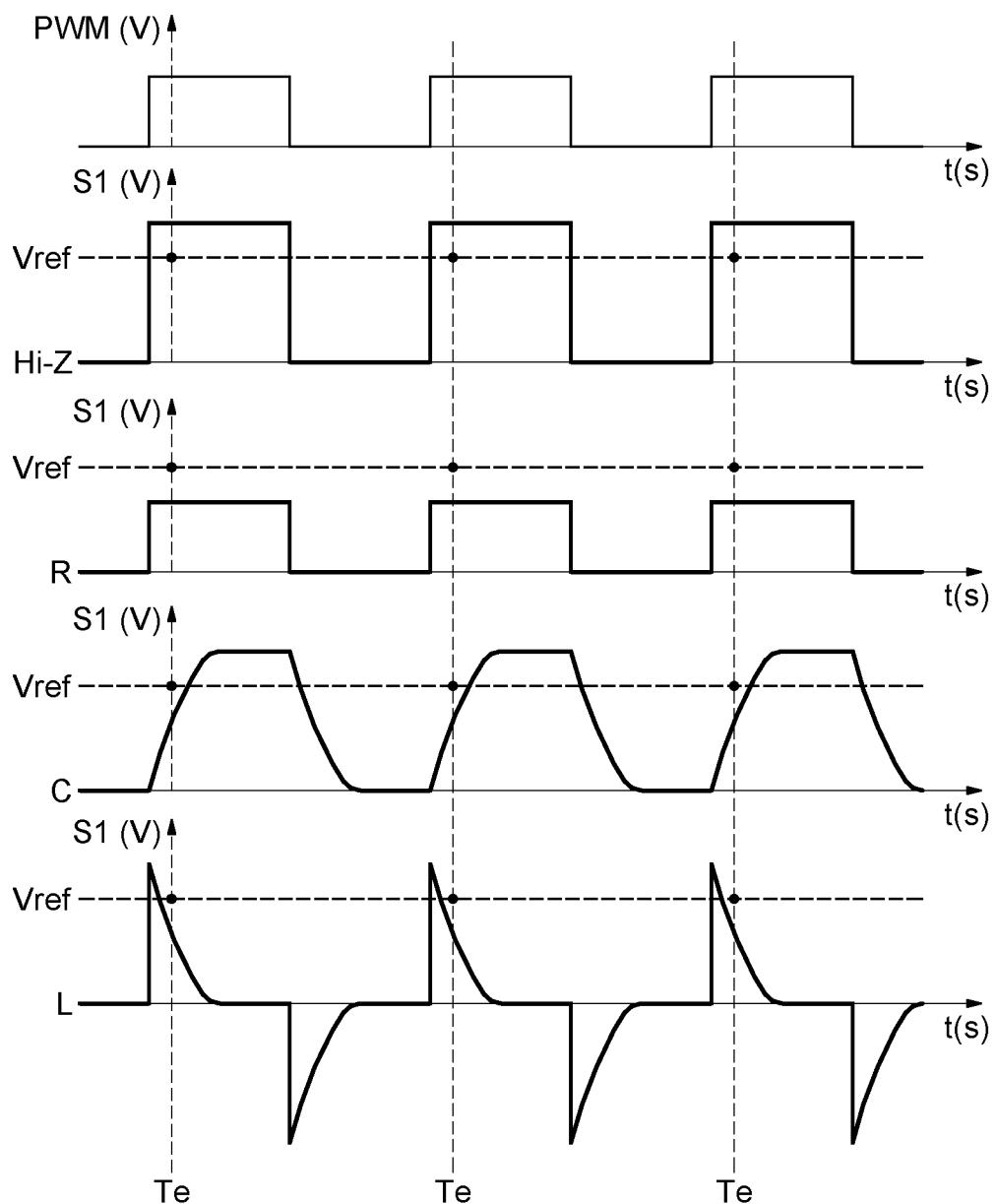
FIG. 3 shows the evolution of the output signal of the load detection device according to the first embodiment and depending on the nature of the load.

FIG. 3 illustrates the evolution of the output signal S1 of the detection device as a function of time, of the nature of the load Z connected to the electrical network and of the evolution of the signal PWM for commanding the load detection device 2.

If there is no load Z connected at the output of the SSPC power supply controller 1, the evolution of the signal S1 at the output of the load detection device 2 is represented by the curve Hi-Z with a maximum value equal to VCC after a very short transitory regime with a time constant equal to the product of the value of the resistor R2 and of the capacitance C1.

If a resistive load Z is connected at the output of the SSPC power supply controller 1, the evolution of the signal S1 at the output of the load detection device 2 is represented by the curve R. The maximum value of the signal is established between 0 and VCC, depending on the value of the resistor R2 and of the resistive impedance of the load Z. The impedance of the load Z and the resistor R2 form a voltage divider bridge.

If a capacitive load Z is connected at the output of the SSPC power supply controller 1, the evolution of the signal S1 at the output of the load detection device 2 is represented by the curve C. The value of the signal ADC gradually reaches the value of the voltage VCC. The time constant is equal to the product of the value of the resistor R2 and of the capacitance of the optional load Z.

If an inductive load Z is connected at the output of the SSPC power supply controller 1, the evolution of the signal S1 at the output of the optional load detection device 2 is represented by the curve L.

The processing unit CPU samples the signal S1 and deduces, from the waveform of the signal ADC, the presence and the nature of the load Z.

A simplified method that makes it possible to determine whether an optional load is connected to the SSPC power supply controller 1 is now described.

A predefined sampling period Te is chosen such that the switch M3 is in the closed position when the signal is acquired by the processing unit CPU. The value of the sampled signal that is obtained is compared with a predetermined reference value Vref. If the value of the sampled signal is lower than the reference value Vref, it is deduced from this that a load Z is connected to the SSPC power supply controller 1.

Figure 4:
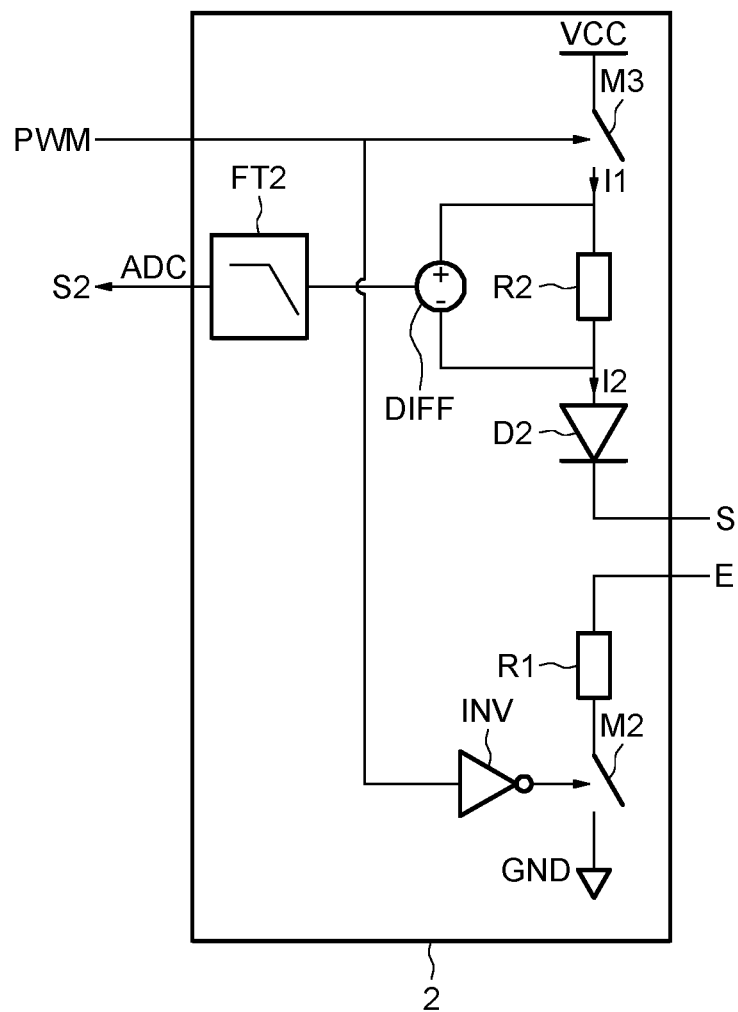
FIG. 4 illustrates a second embodiment of an optional load detection device.

With reference to FIG. 4, which illustrates a second embodiment of the load detection device 2, the presence and the nature of the optional load are identified depending on the waveform of an electric current.

The elements that are identical to those described above are identified by the same reference numerals. As described above, that branch of the circuit of the load detection device that is linked to the output S comprises the source VCC, the switch M3, the resistor R2 and the diode D2. These components are adjacent to one another, as described above.

A current of magnitude I1 flows between the switch M3 and the resistor R2, and a current of magnitude I2 flows between the resistor R2 and the diode D2.

That branch of the circuit of the load detection device that is linked to the input E comprises, as described above, the resistor R1 and the switch M2. These components are adjacent to one another, as described above.

The switches M2 and M3 are driven in a complementary manner by the signal PWM.

A differentiator DIFF is linked to the terminals of the resistor R2.

The positive terminal of the differentiator DIFF measures the current I1, and the negative terminal of the differentiator DIFF measures the current I2.

The output of the differentiator DIFF is linked to the input of an anti-aliasing filter FT2. The output of the filter FT2 is linked to the processing unit CPU via a connection ADC1 in which the signal S2 resulting from the comparison flows.

During operation, according to this second embodiment, the optional electrical load Z is also detected when the main power supply is shut off.

The processing unit CPU drives the two switches M2 and M3, as described above.

The waveform of the output signal S2 of the filter FT2 is dependent on the impedance of the optional load Z.

Figure 5:
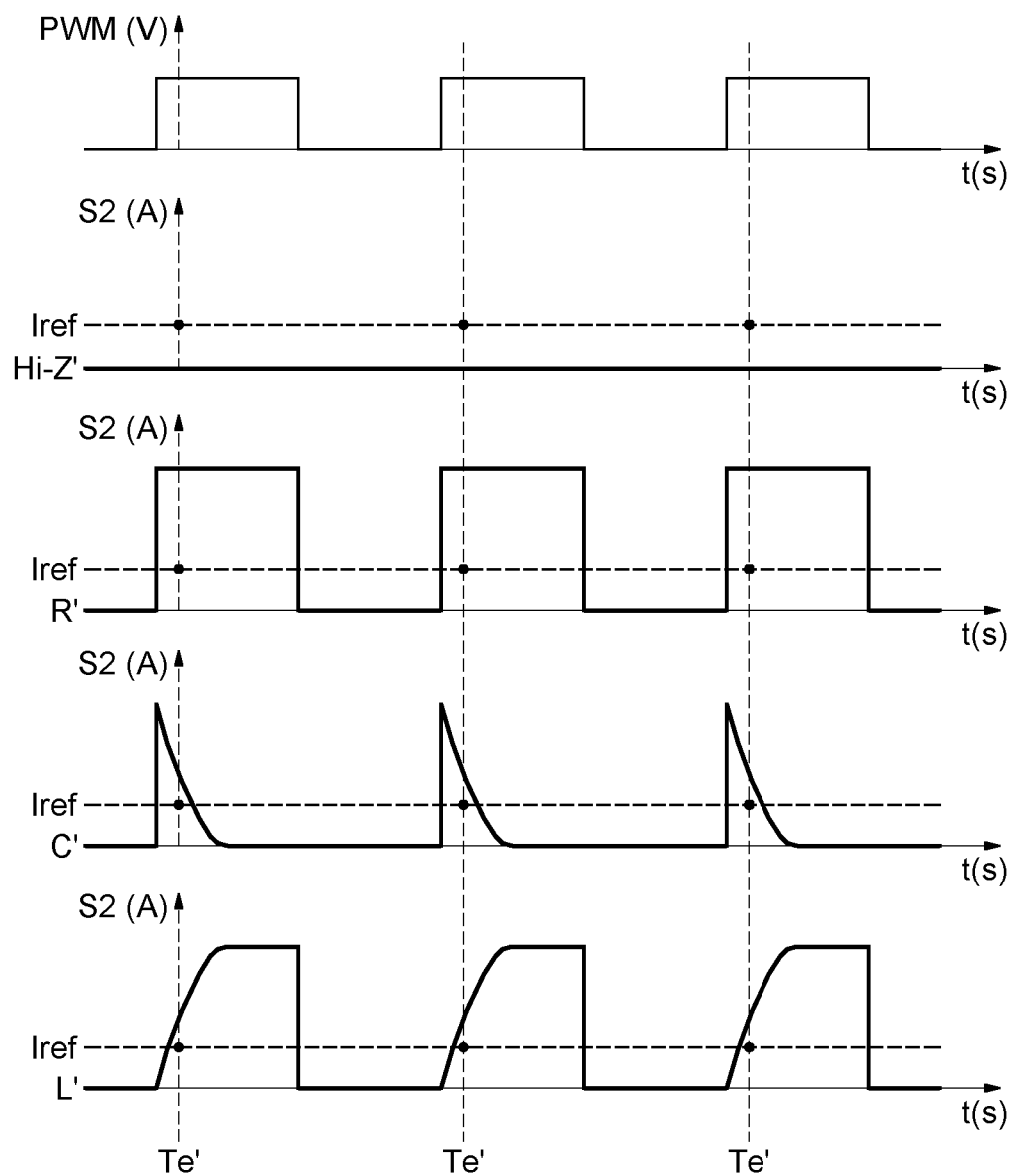
FIG. 5 shows the evolution of the output signal of the load detection device according to the second embodiment and depending on the nature of the load.

FIG. 5 illustrates the evolution of the output current of the detection device as a function of time, of the nature of the load Z connected to the electrical network and of the evolution of the signal PWM for commanding the load detection device 2.

If there is no load Z connected at the output of the SSPC power supply controller 1, the evolution of the current of the output signal S2 is represented by the curve Hi-Z'.

If a load Z of resistive nature is connected at the output of the SSPC power supply controller 1, the evolution of the current of the output signal S2 is represented by the curve R'.

If a load Z of capacitive nature is connected at the output of the SSPC power supply controller 1, the evolution of the current of the output signal S2 is represented by the curve C'.

If a load Z of inductive nature is connected at the output of the SSPC power supply controller 1, the evolution of the current of the output signal S2 is represented by the curve L'.

The processing unit CPU samples the signal S2 and deduces, from the waveform of the output signal S2, the presence and the nature of the load Z.

A simplified method that makes it possible to determine whether a load Z is connected to the SSPC power supply controller 1 is now described.

A predefined sampling period Te' is chosen such that the switch M3 is in the closed position when the signal is acquired by the processing unit CPU. The value of the sampled signal that is obtained is compared with a predetermined reference value Iref. If the value of the sampled signal is higher than the reference value Iref, it is deduced from this that a load Z is connected to the SSPC power supply controller 1.

The switch M2 makes it possible to set the value of the signal S1 or S2 to the value 0 V by discharging the capacitance C1 and the capacitance of the load Z, depending on the nature of the load Z.

After a load detection cycle, closing the switch M2 discharges the capacitors. As a result, the shut-off SSPC power supply controller 1 is restarted. The output signal S1 and S2 of the load detection device is not biased by the presence of accumulated charges in the capacitors.

Setting the capacitances to zero in this way makes it possible to generate a plurality of successive load detection pulses PWM in order to confirm the presence of a load Z.

According to another embodiment that is not shown, the switch M3 is replaced with a current source.

As is appreciated, the electrical load detection device that has just been described does not require programming of the structure of the electrical distribution circuit or adjustment of the programming when changes are made to the connection of the electrical loads. It operates autonomously.

The detection method operates with low currents of a few milliamperes, which do not risk damaging the load Z.

The load detection device moreover makes it possible to monitor the state of the fuse F1 and to verify the integrity of the electrical circuit following an intervention on the SSPC power supply controller 1 without the load Z being supplied with power by the generator G.

Lastly, the processing unit CPU may contain instructions that make it possible to compare the value of the impedance of the load Z with a predetermined impedance value, by comparing the value of the voltage S1 or S2 with the value of a predetermined voltage corresponding to the value of the predetermined impedance.

While illustrative embodiments have been illustrated and described, it will be appreciated that various changes can be made therein without departing from the spirit and scope of the invention.

What is claimed is:

1. A device for detecting an electrical load connected to an electric power supply network, comprising:
    means for injecting a test signal into the electrical network and means for identifying the presence and the nature of an electrical load connected to the electrical network on the basis of the test signal, characterized in that the means for injecting a test signal comprise a current source or a first switch commanded by a processing unit and a very low-voltage source, wherein a nature of the electrical load is detected depending on a waveform of a return signal obtained by the processing unit;
    a resistor electrically connected to the first switch at one node and to a diode at another node; and
    a differentiator (DIFF) configured in parallel with the resistor, wherein the DIFF is configured to measure:
        current I1 into the resistor at one node by a positive terminal of the DIFF, and
        current I2 into the diode at another node by a negative terminal of the DIFF.

2. The device according to claim 1, comprising a second switch commanded by the processing unit, said first and second switches being commanded alternately during operation.

3. The device according to claim 2, wherein the first switch is driven by a pulse width modulated (PWM) signal, and wherein the second switch is driven by inverting the PWM signal.

4. The device according to claim 1, wherein the means for identifying the presence and the nature of the electrical load comprise an anti-aliasing filter connected to a processing unit.

5. A controller for managing the supply of electric power to an electrical load for an aircraft, comprising an electric power supply line and a load detection device linked to said power supply line and comprising means for injecting a test signal into the electrical network and means for identifying the presence and the nature of the electrical load connected to the electrical network on the basis of the test signal, characterized in that the means for injecting a test signal comprise a current source or a first switch commanded by a processing unit and a very low-voltage source, and characterized in that a nature of the electrical load is detected depending on a waveform of a return signal obtained by the processing unit;
    wherein the controller further comprises:
    a resistor electrically connected to the first switch at one node and to a diode at another node; and
    a differentiator (DIFF) configured in parallel with the resistor, wherein the DIFF is configured to measure:
        current I1 into the resistor at one node by a positive terminal of the DIFF, and
        current I2 into the diode at another node by a negative terminal of the DIFF.

6. The controller according to claim 5, wherein the load detection device is connected in parallel across the electric power supply line.

7. The controller according to claim 5, wherein the power supply line comprises a fuse connected in series across the power supply line, the detection device being connected across the power supply line in parallel with the fuse.

8. A method for detecting an electrical load supplied with power by an electric power supply controller comprising an electric power supply line and a device for detecting an electrical load linked to said power supply line, characterized in that the method includes:
    at least one step during which the detection device injects a test signal into the line supplying power to the load, the main power supply of the power supply line being cut, wherein means for injecting the test signal comprise a current source or a first switch commanded by a processing unit and a very low-voltage source; and
    at least one step during which the detection device detects a nature of the electrical load depending on a waveform of a return signal obtained by the device for detecting the electrical load,
    wherein the device for detecting the electrical load comprises:
    a resistor electrically connected to the first switch at one node and to a diode at another node; and
    a differentiator (DIFF) configured in parallel with the resistor, wherein the DIFF is configured to measure:
        current I1 into the resistor at one node by a positive terminal of the DIFF, and
        current I2 into the diode at another node by a negative terminal of the DIFF.

9. The method according to claim 8, wherein the detection device compares a value of the impedance of the load with a predetermined value.

* * * * *